United States Patent
Arrighi

(10) Patent No.: US 7,681,617 B2
(45) Date of Patent: Mar. 23, 2010

(54) LINEAR MULTIPLE FEEDER FOR AUTOMATIC SURFACE-MOUNTING DEVICE POSITIONING APPARATUSES

(75) Inventor: Claudio Arrighi, Carrara (IT)

(73) Assignee: LCM S.r.L., Massa (IT)

( * ) Notice: Subject to any disclaimer, the term of this patent is extended or adjusted under 35 U.S.C. 154(b) by 727 days.

(21) Appl. No.: 11/599,863

(22) Filed: Nov. 14, 2006

(65) Prior Publication Data
US 2007/0169436 A1    Jul. 26, 2007

(30) Foreign Application Priority Data
Nov. 14, 2005    (IT) .................... FI2005A0232

(51) Int. Cl.
*B32B 38/10* (2006.01)

(52) U.S. Cl. .................. 156/584; 156/344; 221/25; 221/72; 414/411; 414/416.05

(58) Field of Classification Search .................. 156/344, 156/584; 221/25, 72, 73, 79, 87; 414/411, 414/416.01, 416.03, 416.05, 416.08, 425, 414/811
See application file for complete search history.

(56) References Cited

U.S. PATENT DOCUMENTS

| | | | |
|---|---|---|---|
| 4,494,902 A | 1/1985 | Kuppens et al. | 414/223 |
| 4,586,670 A | 5/1986 | Vancelette et al. | 242/55 |
| 4,657,158 A | 4/1987 | Faes et al. | 221/25 |
| 5,295,778 A * | 3/1994 | Hirai et al. | 29/739 |
| 5,299,902 A * | 4/1994 | Fujiwara et al. | 414/416.01 |
| 5,515,600 A | 5/1996 | Iwasaki et al. | 29/740 |
| 5,840,594 A * | 11/1998 | Tsubouchi et al. | 438/15 |
| 5,873,691 A * | 2/1999 | Asai et al. | 414/416.01 |
| 6,705,376 B2 * | 3/2004 | Van Der Rijst | 156/584 |
| 6,869,040 B2 * | 3/2005 | Eskang | 242/560 |
| 6,877,541 B2 * | 4/2005 | Ju et al. | 156/541 |

FOREIGN PATENT DOCUMENTS

DE    4137193    5/1993

\* cited by examiner

*Primary Examiner*—Mark A Osele
(74) *Attorney, Agent, or Firm*—Pollack, P.C.

(57) ABSTRACT

A linear multiple feeder for use with an apparatus for automatically positioning surface-mounted devices (SMDs) collected from a tape wound on a reel. The tape has a protective film coating removably attached thereto, for enabling the device to be picked-up. The feeder comprises a support structure, a plurality of reels of tape carrying the device or component rotatably mounted to the structure, motor-driven wheels for retrieving the protective film being detached from the tape to expose those devices or components that are ready for collection, and a plurality of relatively parallel lanes on the support structure. Also provided is a device for forward linear delivery of the tape along the lanes. The lanes are provided with respective elements for separating the film coating entrained axially by the film-retrieving wheels in a direction opposite to that of delivery of the corresponding tape, thereby detaching the film coating from the tape as the latter moves forward.

6 Claims, 4 Drawing Sheets

LINEAR MULTIPLE FEEDER FOR AUTOMATIC SURFACE-MOUNTING DEVICE POSITIONING APPARATUSES

FIELD OF THE INVENTION

The present invention relates generally to the production of electronic components and, more particularly, to surface-mounting technologies and the like.

BACKGROUND OF THE INVENTION

Conventional surface-mounting technologies, as are often used in the manufacture of electronic circuits, involve the use of surface mounted devices (SMDs) of increasingly limited dimensions. SMDs are typically installed using computer-controlled automatic "pick and place" type machines with one or more picking and placing heads, which collect the components from suitable feeders and deposit them in a selected position on a printed circuit board or the like.

To prepare the surface mounted devices for collection from their packaging, feeders are often used. Briefly, the feeders open the packages and locate the devices or components at a position necessary for collection by a positioning head.

Of the numerous packaging methods available today, the type most widely used are those which utilize reels of tape. Specifically, the tape is fed in a forward direction by holes punched in the tape. The feeder then separates and winds up the film that was applied to the tape previously to cover recesses containing the surface mounted devices or components.

Generally speaking, two approaches have been developed for feeding the tape forward and retrieving feed the tape forward and retrieve the film. The first is to drive the tape forward by stepwise rotation of a gear wheel; and the second is to use a system of linear actuators. In gear wheel delivery systems, levering devices are commonly used to rotate the gear wheel and, in turn, feed the tape carrying the surface mounted device forward, while simultaneously operating a system that retrieves the film. Such systems are typically operated by pneumatic actuators or, in some cases, electronic actuators.

As for linear delivery systems, they generally a linear electronic actuator, which drives a carriage assembly, complete with retractable pins holes in the tape, thereby entraining the tape with the carriage assembly, and then disengaging therefrom at the beginning of the assembly's return stroke. Such solutions have been used for both single feeders, i.e., where the tape is installed on a separate delivery device, and multiple feeders, i.e., where several tapes are housed by the same unit and a common actuator is used to drive them forward with a system for selecting only those tape(s) that have been programmed for delivery.

While gear wheel and linear delivery type feeder systems have been found useful, the highly complex configurations that are necessary to achieve high operating precision often makes these systems costly to produce and operate. Gear wheel type feeder systems, in particular, have been found further disadvantageous in requirina that the wheel be able to engage tapes of different thicknesses about an arc of a circle, i.e., that some degree of slack must be allowed between the diameter of the tooth and a hole in the tape. Frequently, however, this presents problems with positioning repeatability when different tapes are used. Moreover, where a machine with single-actuating feeders must perform multiple pickups, that is, when the machine's pickup heads descend simultaneously onto a number of exposed surface mounted devices, a mechanical adjustment system is necessary to align the respective feeders. Therefore, in an apparatus with gear wheel type multiple feeders, an adjuster must be provided on each wheel to guarantee the precision needed for multiple pickups.

As for linear delivery multiple feeders, a mechanical housing structure is usually provided with a linear electronic actuator driving a carriage assembly having a plurality of retractable pins, i.e., that rise and fall due to the effect of respective electromagnetic actuators. Selective engagement of the pins allows only the required tapes to move forward along with the carriage assembly. After forward motion, the actuated carriage assembly then returns to a resting position. In this type of feeder, the film covering the surface mounted device is lifted away from one side to enable the device or component to be picked up. The film then exits from the front of the feeder, still attached to the tape, which is now empty on the other side. In practical terms, as the tape advances, it encounters a shaped blade that severs the film from the tape along one side thereof, raising it sufficiently to expose the surface mounted device. Although helpful, this arrangement increases significantly the dimensions and structural complexity of the feeder, while failing to eliminate the risk of tape movement. In addition, using this system, feeding the tapes has been found considerably more complicated. Such system is also considered sensitive to any differences in the way the film is attached to the tape due to manufacturing defects or aging of the adhesive.

OBJECTS AND SUMMARY OF THE INVENTION

Accordingly, it is an object of the present invention to provide a linear multiple feeder for an automatic surface mounted devices (SMD) positioning apparatus that enables highly precise exposure of the desired electronic devices or components for simultaneous pickup, thereby, ensuring that a plurality of pickup heads descend onto the feeder simultaneously so as to collect a selected number of suitably exposed and perfectly aligned SMDs.

Another object of the present invention is to provide a linear multiple feeder for an automatic surface mounting device positioning apparatus that is smaller and less expensive than comparable feeders of equivalent performance.

A further object of the present invention is to provide a linear multiple feeder e for an automatic surface mounting device positioning apparatus precision and reliability that are unaffected by an extraordinary number of operating cycles.

According to one aspect of the present invention, there is provided a linear multiple feeder for an automatic surface mounting device positioning apparatus. The device comprises a support structure, a plurality of reels of tape carrying the device rotatably mounted to the support structure, a member for retrieving a protective film detached from the tapes when the device or component is exposed for collection, a plurality of relatively parallel lanes on the support structure for delivering the tapes provided, downstream of the film-retrieving member, and a device for forward linear delivery of the tapes along the lanes. The apparatus comprises a carriage assembly moving alternately between two stops and carrying a row of tape-entraining pins selectively engageable with holes in the tape and inside the lanes so as to carry forward only those tapes selected. Respective elements are provided between the lanes for separating the film coating, drawn axially along by the film-retrieving member, in a direction opposite to that of delivery of the respective tape, in order to detach the film coating from the forward-moving tape, and force it against the separator elements. The tension created in the film coating by the film-retrieving member is suitable for biasing the separators against the bottom of their respective lanes and, thereby, preventing movement of those tapes that have not been selected for delivery, by locking them between the separators and the bottom of the lane.

BRIEF DESCRIPTION OF THE DRAWINGS

A specific, illustrative linear multiple feeder for automatic SMD positioning machines, according to the present invention, is described below with reference to the accompanying drawings, in which.

The same numerals are used throughout the drawing figures to designate similar elements. Still other objects and advantages of the present invention will become apparent from the following description of the preferred embodiments.

DETAILED DESCRIPTION OF THE PREFERRED EMBODIMENTS

Figure 1:
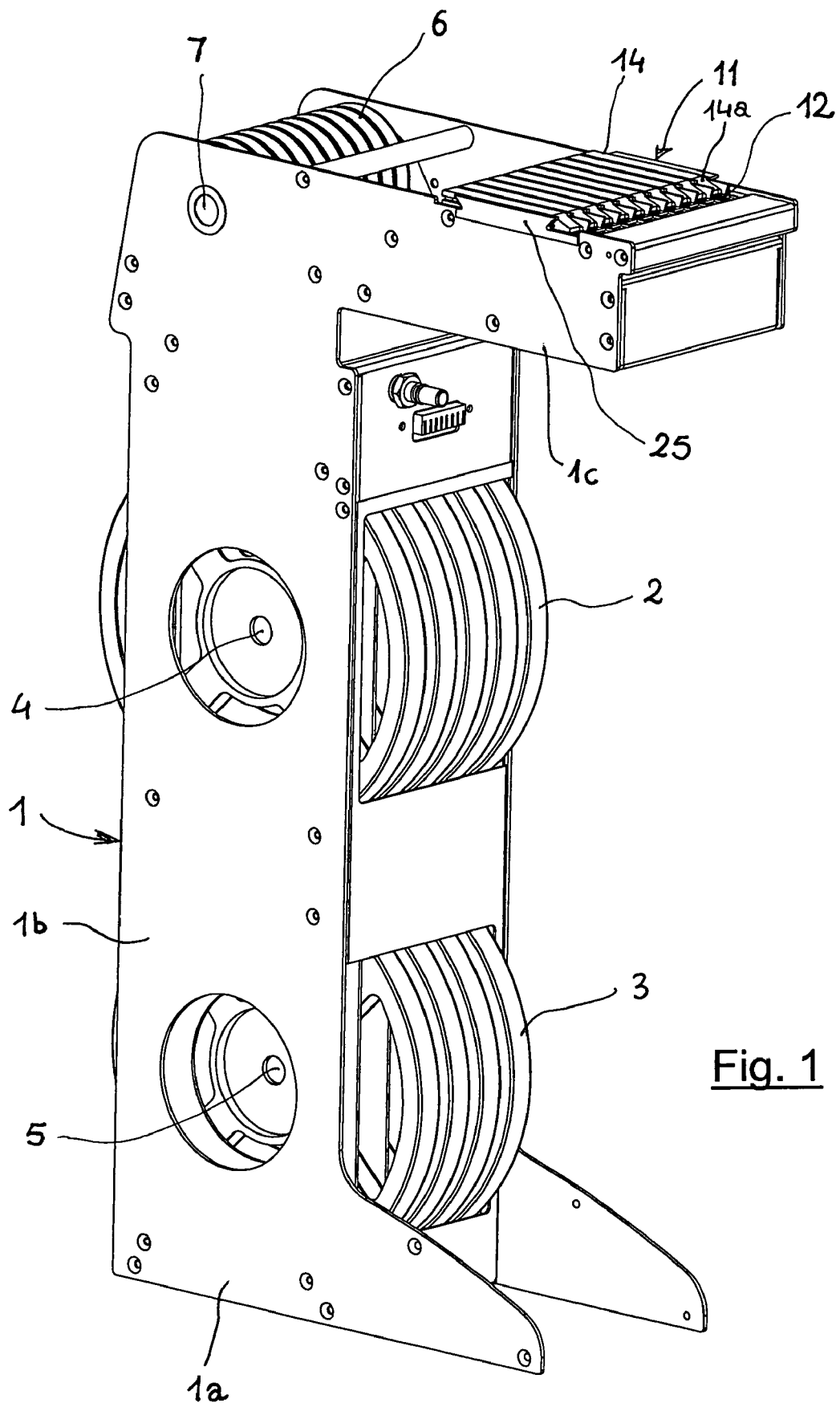
FIG. 1 is a perspective view of a linear multiple feeder for automatic SMD positioning machines, according to one aspect of the present invention.
Figure 2:
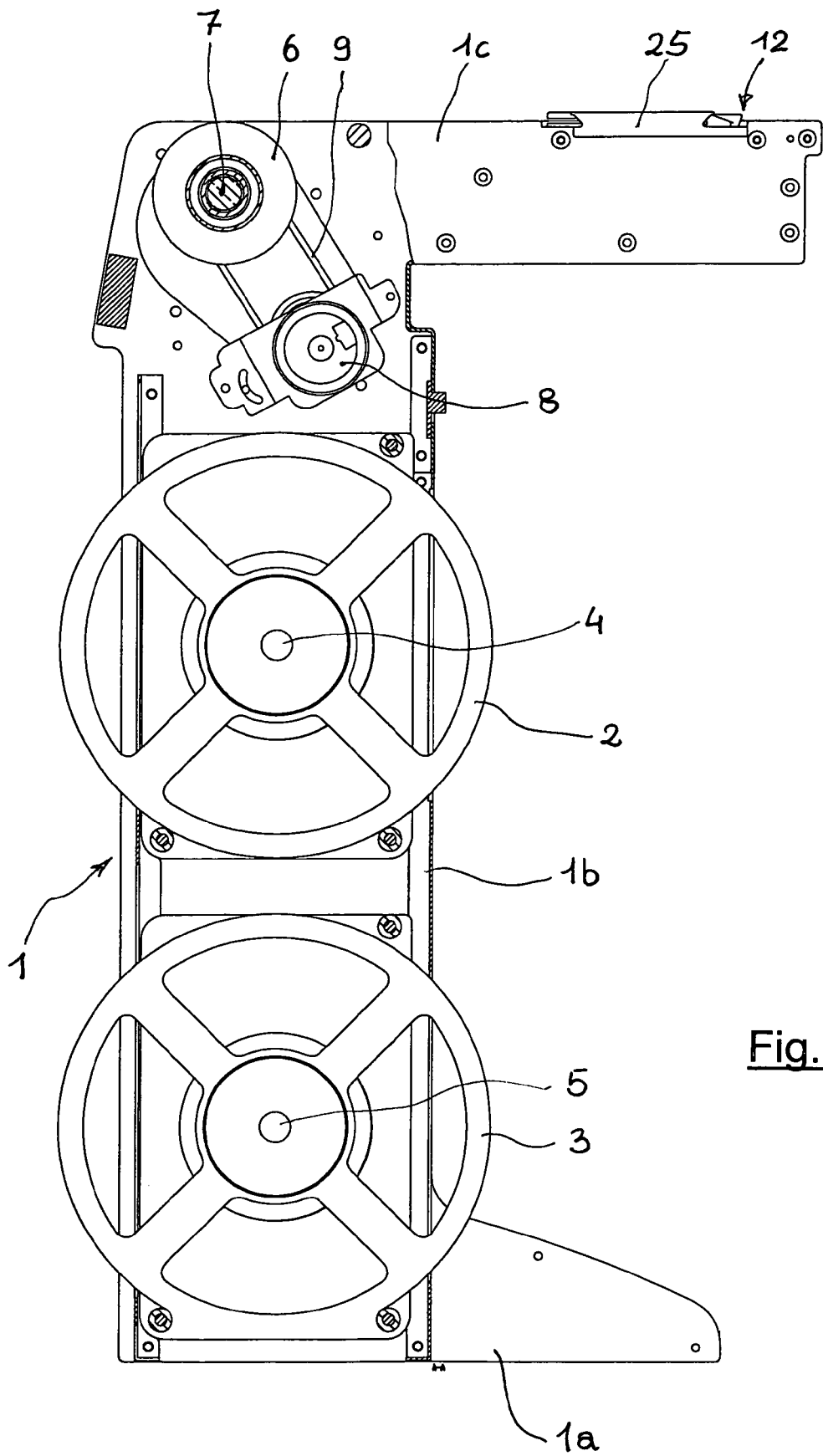
FIG. 2 shows a partial lateral cross-section of the feeder illustrated in FIG. 1.

Referring now to the drawings and, more particularly, to FIGS. 1-6, there is shown generally a specific, illustrative linear multiple feeder for an automatic surface-mounting device (SMD) positioning apparatus, according to various aspects of the present invention. In one embodiment, illustrated in FIGS. 1-3, the feeder has a relatively rigid, box-like frame comprising a base portion 1a, an upright portion 1b rising from the base portion, and a top portion 1c extending generally horizontally from a free end of the upright portion. Inside upright portion 1b, reels 2, 3 are desirably mounted rotatably on respective spindles 4, 5 supported on either side, preferably at two different heights, by the upright portion. It is preferred that the reels be staggered relatively vertically so as to avoid any interference between tape(s) containing the SMD being unwound therefrom. At an upper end of upright portion 1b, generally at the same height as top portion 1c, a shaft 7 is provided on which a battery of driving wheels 6 is integrally mounted for retrieving a film coating detached from the tape containing the SMD. The shaft is connected to a geared motor 8 by a traditional pulley transmission system (not shown) having a geared wheel 9, shown in FIG. 2.

Figure 5:
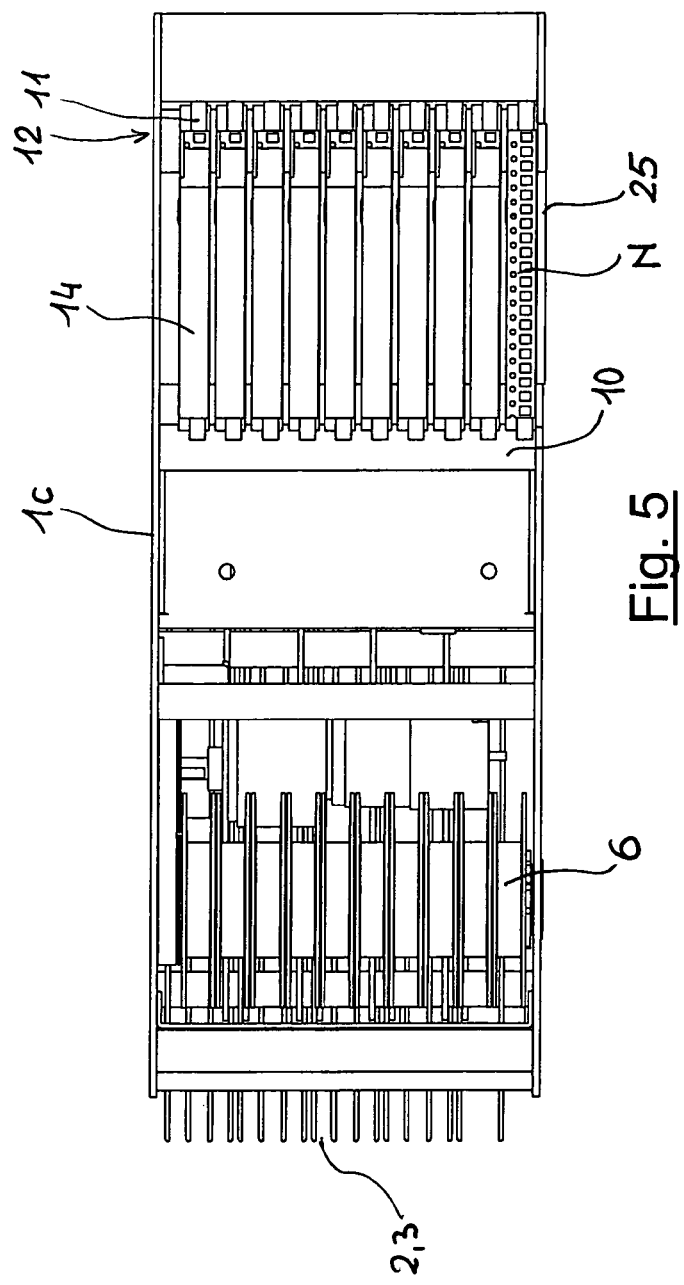
FIG. 5 is a plan view of the front portion shown in FIG. 3.

As shown in FIG. 5, top portion 1c comprises a horizontal bed 10 having a plurality of longitudinal lanes 11, lying generally parallel to one another, for controlled feeding of the tape carrying the devices or components toward a pickup area 12, situated at a free end of the top portion. Inside top portion 1c, underneath bed 10, a device 13 is provided for feeding the tape forward. The lanes also contain respective film separators 14 comprising suitably shaped bars, as described in more detail below.

Figure 3:
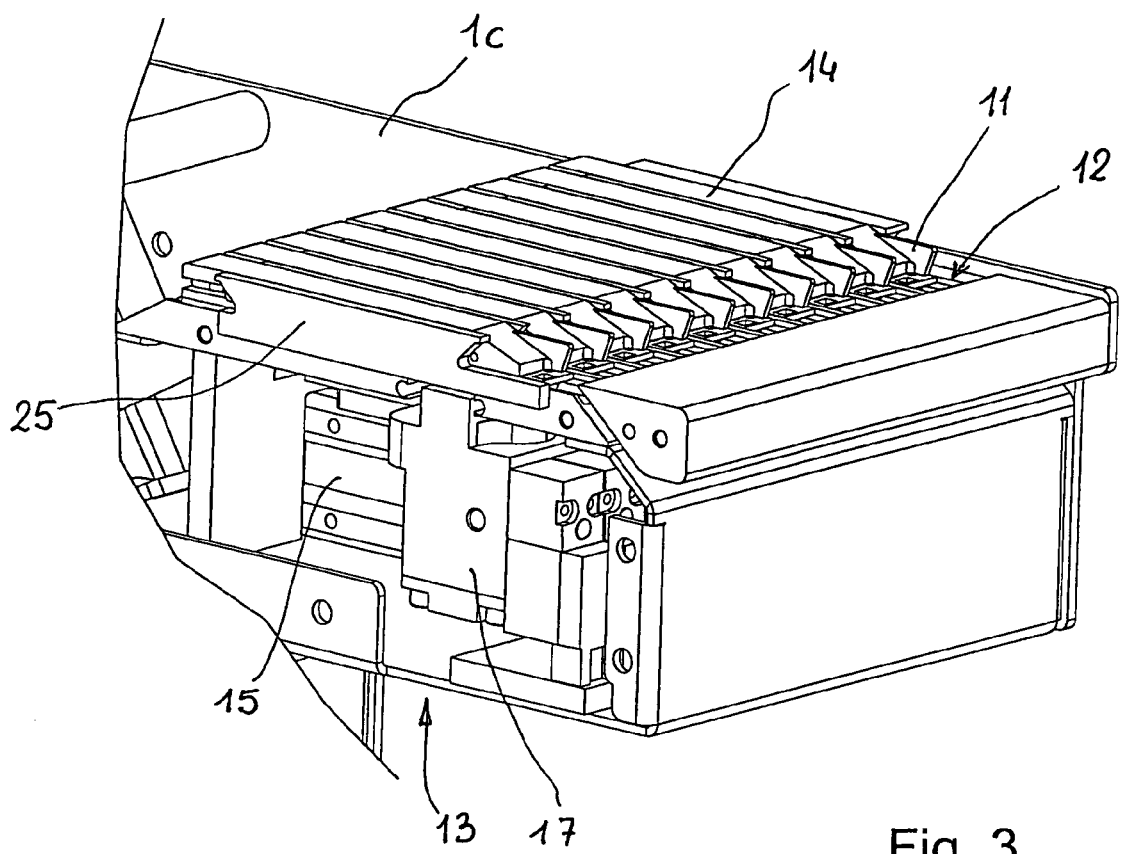
FIG. 3 is an enlarged perspective view of a front portion of the feeder shown in FIG. 1.
Figure 4:
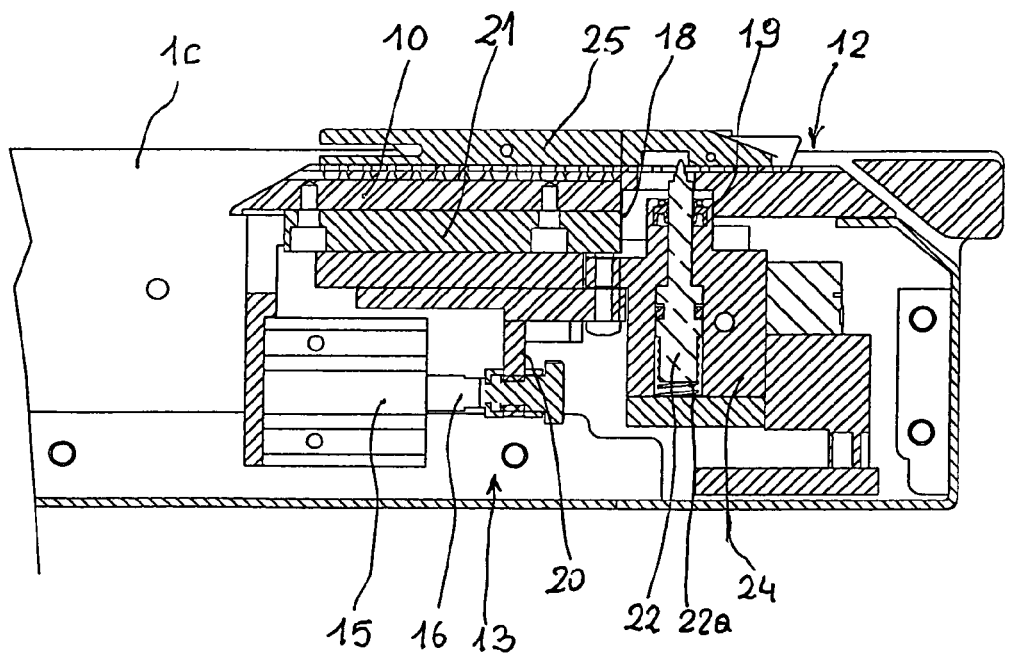
FIG. 4 is a sectional view taken longitudinally of the feeder shown in FIG. 1.

Turning now to FIGS. 3 and 4, delivery device 13 includes a pneumatic actuator 15, according to one embodiment of the present invention, attached securely to bed 10 with a mobile stem 16. The stem is connected via a bracket 20 to a transverse carriage 17 and a block 21 sliding inside a guide (not shown) integral to the bed. Furthermore, the carriage is movable longitudinally between two stops 18 and 19.

Inside carriage 17 is a row of tape-entraining pins 22 crosswise relative to one another. Each pin has a body 22a that fits inside a seat 23 in the carriage and is configured such that its pointed end projects from a head 17a extending crosswise over the carriage. The pins are preferably arranged vertically with their pointed ends facing lanes 11 and movable axially within the carriage so as to selectively engage with or disengage from guide holes aligned along at least one side of the tape carrying the SMD. The tape and its length N are best seen in FIG. 5. The axial movement of pins 22 is controlled by pneumatic actuators 24.

Figure 6:
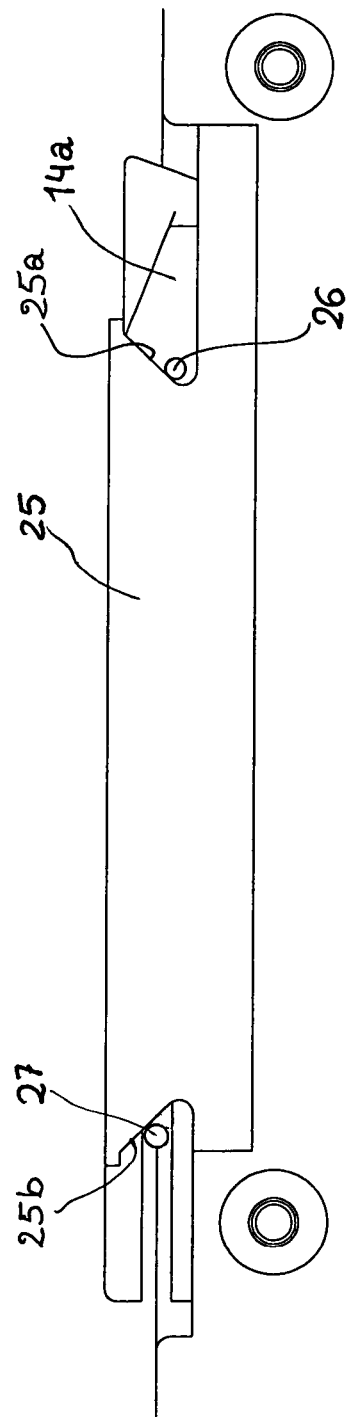
FIG. 6 is an enlarged view of a side wall of a pick-up station, according to one aspect of the present invention.

Longitudinal or sliding lanes 11 have side walls 25 with film separators 14 mounted therebetween. As illustrated in FIG. 6, side walls 25 present frontally (i.e., in an area facing pickup section 12) an edge 25a sloping in a direction opposite to the pickup section and, toward the bottom of the respective lane, against which a blocking pin 26 (that extends across front end 14a of separator 14) abuts. Front end 14a is substantially wedge-shaped for guiding the film coating, which slides over the separator, and abuts end 14a, after it has detached from the tape carrying the SMD. This is considered to be a result of tensile stress exerted by the respective film rewinding wheel from which it is retrieved.

Opposite edge 25b of walls 25 slopes in a direction generally opposite to that of edge 25a and serves as a striker for a second transverse pin 27 joined to a spring (not shown) housed longitudinally by separator 14.

When the feeder is at rest, tapes with the SMDs are placed in respective lanes 11 and the protective film, already detached partially from the respective tapes, passes over separators 14, and is wound about respective film-retrieving driving wheels, which are not in motion. Carriage 17 is in its withdrawn position up against rear stop 18, and pins 22 are each in engagement with a hole in the respective tapes.

When a delivery signal is issued, geared motor 8 effects rotation of the film-retrieving driving wheels 6, thereby drawing the film coating taut. The tension on the film coating bears against ends 14a of the separators, which are thus drawn back. Given the restraining effect of blocking pins 26 abutting sloping edges 25a, which causes the pins to slide along the sloping edges, separators 14 are pushed downwardly, coming to rest on the tapes, and holding them against the bottom of their respective lanes 11. Meanwhile, to disengage tape-entraining pins 22 from the respective tapes, the pins are withdrawn, i.e., inside carriage 17, with the exception of those pins engaged with the tapes selected for delivery. Carriage 17 advances to front stop 19, entraining those tapes in which the selected pins have remained engaged, while drive wheels 6 continue to keep the film taut.

Once the SMDs have been collected, the tape-entraining pins in engagement with the selected tapes drop back into the carriage, thereby becoming disengaged from the tape, and the carriage returns to the opposite end of its stroke 18, while film retrieving drive wheels 6, as a result of the delivery stroke, effect retrieval of the film detached from the selected tapes. The all the tape-entraining pins then reemerge, and hook up the tapes again, while drive wheels 6 stop and the feeder returns to its starting or resting condition, ready for a new feeding cycle.

In this manner, because of the tension maintained on the film coatings, which would normally tend to displace them, the tapes that need not move forward are kept stationary by the separators And because the tapes that do not need to advance are held in place, utmost precision and repeatability of the delivery cycles is ensured. This, in turn, assures that there is not even minimal movement that would prevent subsequent engagement of the tape-entraining pins with the holes in the tapes when the carriage is drawn back.

Second transverse pin 27 desirably exerts an auxiliary tensile action in the same direction as that exerted by film-retrieving wheels 6. This auxiliary action is useful both to reinforce the downward thrust toward the bottom of lanes 11, which helps to retain the tapes securely therein, and to compensate for any (e.g., ultimately unavoidable) discrepancy in the turning speeds of the film-retrieving wheels. Finally, the combined opposing action of transverse pins 26 and 27 assures relatively stable positioning of separators 14 in their respective lanes 11, preventing their accidental or unwanted displacement.

Moreover, providing movement of carriage 17 with a fixed stroke between stops 18 and 19 helps to ensure simply and reliably superior repeatability of exposure of the devices or components. In addition, by the present invention, assembly of the tapes on the feeder is straightforward and practical because the film separators may easily rest on the tapes and can therefore, be promptly removed from their respective lanes, to allow for the positioning of the tapes, and then be put back in place.

Various modifications and alterations may be appreciated based on a review of this disclosure. These changes and additions are intended to be within the scope and spirit of the invention as defined by the following claims.

What is claimed is:

1. A linear multiple feeder for surface-mounted device automatic positioning apparatus, the device being arranged on a tape and wound about a reel, and the tape having a protective film coating removably attached thereto, and separable therefrom for enabling the device to be collected, the feeder comprising a support structure, a plurality of reels of tape carrying the device rotatably mounted to the structure, a member for retrieving the protective film detached from the tape when the device or components are exposed for collection, a plurality of relatively parallel lanes on the support structure, downstream of the film-retrieving member, a device for forward linear delivery of the tape along the lanes, the delivery device including a carriage moving alternately between two stops and carrying a row of tape-entraining pins selectively engageable with holes in the tape and inside the lanes so as to carry forward only those tapes selected, wherein respective elements are provided between the lanes for separating the film coating, drawn along axially by the film-retrieving member, in a direction opposite to that of delivery of the respective tape, in order to detach the film coating from the forward-moving tape, and forcing it against the separator elements, whereby the tension created in the film coating by the film-retrieving member is suitable for biasing the separators against the bottom of their respective lanes and, thereby, preventing movement of those tapes that have not been selected for delivery, by blocking them between the separators and the bottom of the lane.

2. The multiple feeder set forth in claim 1, wherein the front end of the separator elements abuts the respective film under tensile stress, at least one tape entraining pin extending generally crosswise from the end and abutting an edge of a side wall of the respective lane, the edge sloping in the direction opposite to that of forward delivery of the tape in the lane and leading downwardly toward the bottom of the lane.

3. The multiple feeder set forth in claim 1, wherein a lateral wall of each lane has a further edge that slopes in a direction opposite to the one that a blocking pin abuts, a further transverse pin being provided at a rear end of the separators that abuts the sloping edge, the transverse pin being elastically joined to the respective separator to force against the further edge.

4. The multiple feeder set forth in claim 1, wherein the film-retrieving member comprises respective coaxial drive wheels on the support structure and operatively associated with a motor.

5. The multiple feeder set forth in claim 1, wherein the stops include a plurality of fixed abutment elements.

6. The multiple feeder set forth in claim 1, wherein the front end of the separator elements, on which the relevant tensioned films abut, is substantially wedge shaped.

* * * * *